United States Patent [19]

Meyer et al.

[11] Patent Number: 4,833,404
[45] Date of Patent: May 23, 1989

[54] TEST PROBE FOR SURFACE MOUNTED LEADLESS CHIP CARRIER

[75] Inventors: Kerry L. Meyer, Raytown, Mo.; John Topolewski, Lenexa, Kans.

[73] Assignee: The United States of America as represented by the United States Department of Energy, Washington, D.C.

[21] Appl. No.: 103,865

[22] Filed: Oct. 2, 1987

[51] Int. Cl.[4] ............................................... G01R 1/06
[52] U.S. Cl. ............................ 324/158 P; 324/73 PC; 324/158 F; 439/54
[58] Field of Search ............ 324/158 R, 158 F, 158 P, 324/73 PC; 439/50, 54, 55, 71, 72, 80, 81

[56] References Cited

U.S. PATENT DOCUMENTS

| | | | |
|---|---|---|---|
| 3,506,949 | 4/1970 | Venaleck et al. | 339/174 |
| 4,340,858 | 7/1982 | Malloy | 324/72.5 X |
| 4,340,860 | 7/1982 | Teejde, Jr. | 324/158 P X |
| 4,476,433 | 10/1984 | Logan | 324/158 P |
| 4,516,072 | 5/1985 | Marpoe, Jr. | 324/158 |
| 4,564,251 | 1/1986 | Hansen et al. | 339/17 |
| 4,639,058 | 1/1987 | Morgan | 339/17 |
| 4,675,599 | 6/1987 | Jensen et al. | 324/158 P UX |
| 4,705,333 | 11/1987 | Sicard et al. | 324/158 F X |

OTHER PUBLICATIONS

AP Products Catalog, Copyright 1985, p. 2.
AP Products, 3M, Data Sheets (2 Pages, Undated, Identified as Exhibits A and B).

Primary Examiner—Reinhard J. Eisenzopf
Assistant Examiner—Warren S. Edmonds
Attorney, Agent, or Firm—George H. Libman; James H. Chafin; William R. Moser

[57] ABSTRACT

A test probe for a surface mounted leadless chip carrier is disclosed. The probed includes specially designed connector pins which allow size reductions in the probe. A thermoplastic housing provides spring action to ensure good mechanical and electrical contact between the pins and the contact strips of a leadless chip carrier. Other features include flexible wires molded into the housing and two different types of pins alternately placed in the housing. These features allow fabrication of a smaller and simpler test probe.

9 Claims, 1 Drawing Sheet

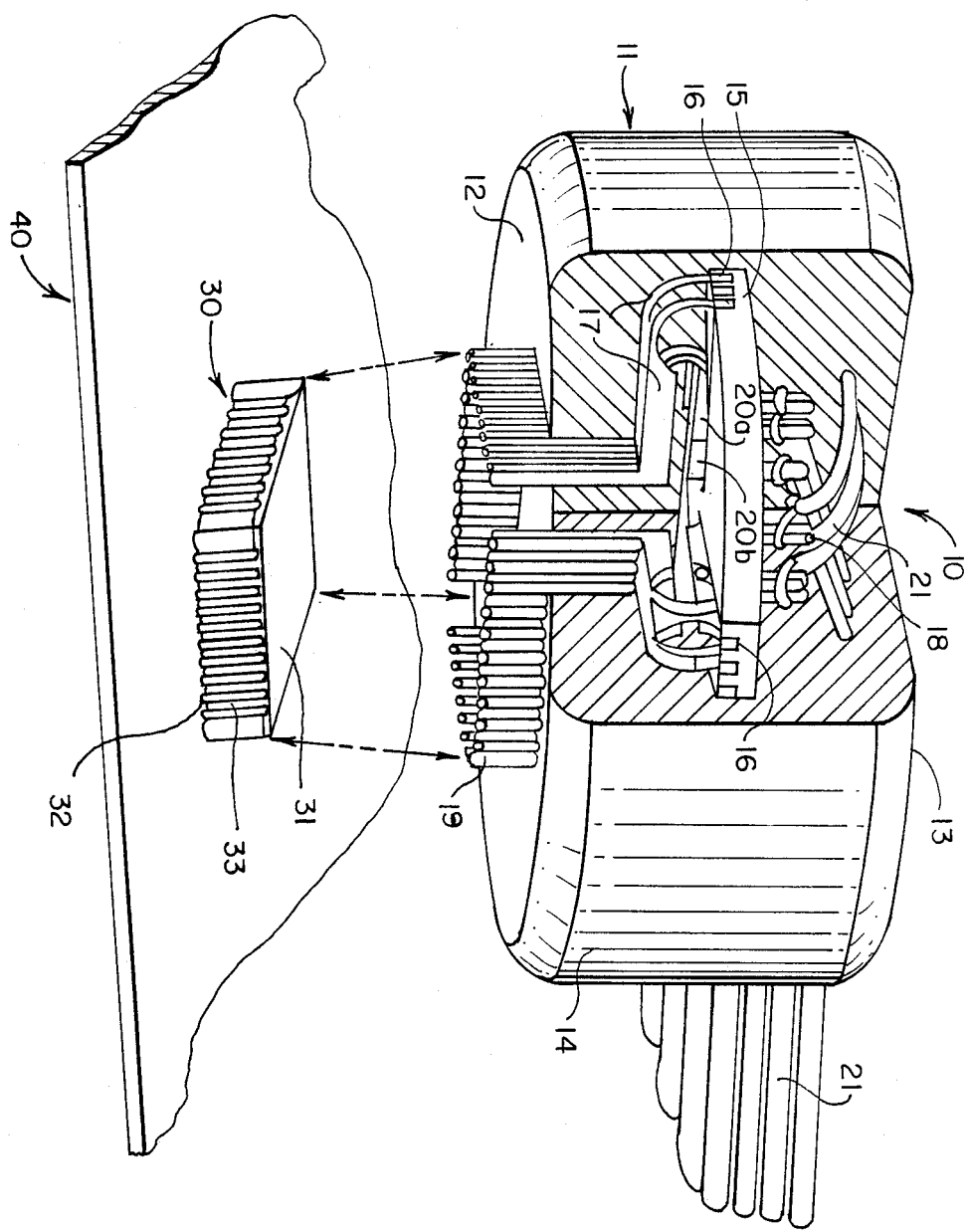

TEST PROBE FOR SURFACE MOUNTED LEADLESS CHIP-CARRIER

The present invention was made under DOE contract number DE-AC04-76DP00613 between the Department of Energy and Allied Corporation.

FIELD OF THE INVENTION

The present invention relates to a device for troubleshooting and circuit verification at the interface between a leadless chip carrier and a circuit.

BACKGROUND OF THE INVENTION

A printed circuit board will usually contain several components and may contain one or more leadless chip carriers. Leadless chip carriers come in a variety of sizes and external pin arrangements. There are two ways to mount a leadless chip carrier to a printed circuit board. The first way is to mount a socket to the printed circuit board and then insert the leadless chip carrier into the socket making contact to the printed circuit board through the contacts located in the socket. The second way to mount a leadless chip carrier to a printed circuit board is to solder the leadless chip carrier directly to the printed circuit board. The second method is called surface mounting.

It is often desirable to monitor signals being transmitted between a leadless chip carrier and the circuit of a printed circuit board to which the leadless chip carrier is connected. In this manner, the circuit board can be tested. Monitoring signals between a leadless chip carrier and a printed circuit board provides an excellent way of troubleshooting a circuit board assembly. It is highly desirable to be able to troubleshoot a printed circuit assembly without removing the leadless chip carrier or any other components therefrom.

A device for testing socket mounting leadless chip carriers is disclosed in U.S. Pat. No. 4,516,072 issued on May 7, 1985. This device is used in testing and analyzing a printed circuit board. A test probe clips into a leadless chip carrier socket which is mounted to the printed circuit board. This test probe can then be used to test only the external circuitry on the printed circuit board. This is a very limited application for testing and troubleshooting. Moreover, this test probe cannot be used to test surface mounted leadless chip carriers.

Another example of a test probe for testing socket mounted leadless chip carriers is disclosed in U.S. Pat. No. 4,564,251 issued on Jan. 14, 1986. This leadless chip carrier adaptor also clips into a leadless chip carrier socket which is mounted to a printed circuit board. The leadless chip carrier may then be inserted into the test probe and the external circuitry, the leadless chip carrier, or both the external circuitry and the leadless chip carrier may be tested. However, this test probe is limited to testing of socket mounted leadless chip carriers and cannot be used to test surface mounted leadless chip carriers.

A device for testing surface mounted leadless chip carriers is a surface mount test clip manufactured by Minnesota Mining and Manufacturing. This surface mount test clip includes straight pins in a tall package. This test clip is limited to testing components which are spaced no closer than 0.200 inches with a pin-to-pin center spacing on the component of no less than 0.100 inches. The device uses a helical compression spring and insulating contact combs to ensure integrity of contact between the pins and the leadless chip carrier when testing. The probe also includes square contact pins to permit attachment of female socket connectors or wire wrapping to the test clip. This test clip suffers from the disadvantage that its relative height when compared to the height of the leadless chip carrier is quite large. As a result, external force applied to the test clip from attaching wires or test clips to the allotted pins protruding from the top of the test clip can make the test clip fall off of the leadless chip carrier. Also, this test clip is too large for use in densely packed circuit environments.

Accordingly, there is a need in the art for a test probe for surface mounted leadless chip carriers that can be used in densely packed circuit environments. In addition, there is a need in the art for a test probe for surface mounted leadless chip carriers having a means for remotely connecting the test probe to test components to thereby avoid application of force to the test clip from test components attached thereto.

SUMMARY OF THE INVENTION

The present invention relates to a device for use in testing and analyzing a leadless chip carrier package which is surface mounted to a printed circuit board. The device comprises a thermoplastic housing having a top, a bottom and at least one side. A plurality of connector pins each having a first end mounted in the housing and a second end protrude from the bottom of the housing. The second ends are arranged to mechanically contact with the grooves of a leadless chip carrier. A plurality of flexible wires are respectively connected to one of the first ends of the connector pins inside the thermoplastic housing. These wires protrude from the housing to provide a flexible means for remote attachment of test components to the device. In a preferred embodiment of the invention, the device includes a resilient thermoplastic housing which exerts pressure on the connector pins to hold them in contact with the grooves of a leadless chip carrier. In the preferred embodiment, the device also includes two different types of connector pins which have their first ends offset from their second ends to thereby provide additional space for connection of the wires to the connector pins.

It is a primary object of the present invention to provide a test probe for testing and analyzing surface mounted leadless chip carriers which can be used in densely packed circuit environments.

It is also an object of the present invention to provide a test probe for testing and analyzing surface mounted leadless chip carriers having a smaller pin-to-pin center spacing than those previously known in the art.

It is a further object of the present invention to provide a test probe for surface mounted leadless chip carriers which uses the resilience of a thermoplastic or thermosetting elastic material to maintain good electrical and mechanical contact between the connector pins of the test probe and the leadless chip carrier contact strip interface.

It is a still further object of the present invention to provide a test probe for surface mounted leadless chip carriers having flexible wires molded therein which thereby provide a flexible means for remotely attaching test components to the test probe without exerting undue force on the test probe.

It is yet another object of the present invention to provide a test probe for surface mounted leadless chip carriers which, due to its configuration, is smaller than any known test probes for surface mounted leadless chip carriers.

Other features and objects of the present invention will be apparent to one of ordinary skill in the art from the detailed description which follows.

BRIEF DESCRIPTION OF THE DRAWING

The single FIGURE is a partial cutaway perspective view of a preferred embodiment of the test probe of the present invention adjacent a surface mounted leadless chip carrier.

DETAILED DESCRIPTION OF THE PREFERRED EMBODIMENT

Referring now to the Figure there is shown a test probe 10, a leadless chip carrier 30, and a printed circuit board 40. Leadless chip carrier 30 is surface mounted and therefore is soldered directly to printed circuit board 40 and cannot be removed for troubleshooting or testing. Leadless chip carrier 30 includes a top 31 and grooves 32 along the side edges of leadless chip carrier 30. In each groove 32 is a contact strip 33 which is soldered directly to a component of printed circuit board 40.

Test probe 10 includes a thermoplastic housing 11 having a top 13, a bottom 12 and at least one side 14. Molded inside of housing 11 is a rigid pin holder 15. Pin holder 15 includes a plurality of slots 16 into which pins 17 are mounted. Pins 17 include a first end 18 which is molded into thermoplastic housing 11, and a second end 19 which protrudes from bottom 12 of housing 11. Pins 17 also include in an alternating sequence either a short upper arm 20a and lower arm 22a or a long upper arm 20b and lower arm 22b extending towards side 14 of housing 11 in slots 16 of pin holder 15 to space adjacent pins relative to each other and to permit limited lateral movement of seconds ends 19 relative to first ends 18 and housing 11, as discussed hereinafter. Attached to first end 18 of pins 17 are respective flexible wires 21 which are bundled together and pass out of the side of housing 11 as shown in the Figure.

To mount test probe 10 over leadless chip carrier 30, one merely aligns second ends 19 of pins 17 with corresponding contact strips 33 of leadless chip carrier 30. Then, test probe 10 fits over leadless chip carrier 30 as indicated in the Figure. Once test probe 10 is mounted on leadless chip carrier 30, bottom 12 of housing 11 is in contact with top 31 of leadless chip carrier 30. In addition, second ends 19 of pins 17 fit into corresponding grooves 32 and thus mechanically and electrically contact contact strips 33 of leadless chip carrier 30.

Housing 11 of test probe 10 is preferably fabricated from a moldable thermoplastic material. This material is preferably resilient and non-conductive. It has been found that a resilient silicone elastomer potting material such as RTV-630 is a preferred material for fabrication of housing 11. The resilience of the elastomeric potting material used to fabricate housing 11 allows pins 17 in probe 10 to flex laterally during the attachment of probe 10 to leadless chip carrier 30. Thermoplastic housing 11 also exerts lateral pressure on pins 17 as a result of the resilience of housing 11. Thus, good electrical contact between the sides of second ends 19 of pins 17 and contact strips 33 is maintained through lateral pressure exerted on the pins 17 which, in turn, causes pressure to be exerted on the pin-to-leadless chip carrier contact strip interface by the second ends 19 of the pins 17.

Pin holder 15 is preferably a rigid, non-conductive board which is molded into housing 11 along with pins 17. As mentioned above, pin holder 15 preferably includes a plurality of slots 16 into which pins 17 are inserted. With this configuration, pin holder 15 maintains pins 17 in the necessary configuration for pins 17 to fit properly over leadless chip carrier 30. However, a sufficient length of each pin 17 protrudes below pin holder 15 to allow the spring action of thermoplastic housing 11 to bias pins 17 into good electrical and mechanical contact with contact strips 32.

Flexible wires 21 may be color-coded flat wires which are grouped into four bundles as shown. Each bundle then preferably includes the same number of wires 21 as there are contact strips 32 on a single side of leadless chip carrier 30. This arrangement makes it simple to determine which wires 21 correspond to which contact strips 32 of leadless chip carrier 30.

In an alternative preferred embodiment (not shown), wires 21 are preferably flat-flex circuit cables. This particular type of cable allows for a reduction in the size of test probe 10.

As shown, each flexible wire 21 is suitably attached to a respective first end 18 of a respective pin 17. Wires 21 are then grouped together and are routed in a bundle out one side of housing 11. The ends of flexible wires 21 which are attached to first ends 18 of pins 17 are thus permanently molded into the thermoplastic housing 11. This particular configuration of wiring allows test probe 10 to be fabricated in a much smaller size than was previously possible. In addition, the use of flexible wires 21 permanently molded into thermoplastic housing 11 eliminates the need for connecting wires or components directly to exposed ends of pins as in prior art test probes. Hence, undue strain is not put on test probe 10 by the connection of wires or components directly to exposed pins at a distance above the leadless chip carrier. This strain is eliminated by making connections to flexible wires 21 at a distance from test probe 10 and leaving slack in flexible wires 21 to thereby avoid the exertion of lateral force on test probe 10.

Pins 17 of test probe 10 are specially designed to minimize the amount of space which they take up, as well as to provide other benefits. Second ends 19 of pins 17 protrude from bottom 12 of housing 11 and make contact with contact strips 33 found in grooves 32 of leadless chip carrier 30 when test probe 10 is mounted in the test position. Second ends 19 of pins 17 are capable of flexing due to the resilience of thermoplastic housing 11. This flexing allows second ends 19 of pins 17 to be easily mounted over leadless chip carrier 30.

This preferred embodiment of test probe 10 includes two different types of pins 17 as noted above. The first type of pin 17 includes short upper arm 20a and the second type of pin 17 includes a long upper arm 20b. The difference in length between upper arm 20a and upper arm 20b, defined as the offset distance, provides an offset between first ends 18 of pins 17. Pins 17 having short upper arms 20a are alternately mounted with pins 17 having long upper arms 20b. This design provides additional room for connecting flexible wires 21 to first ends 18 of pins 17 since first ends 18 are offset the additional distance provided by the difference in length of upper arms 20a and 20b. Such additional space helps eliminates short circuits between adjacent pins 17 in test probe 10.

Pins 17 are also shorter than standard pins used in test probes for leadless chip carriers. This, in turn, allows housing 11 to be of a smaller size than previously possible for such test probes. The smaller size of test probe 10 allows it to fit into tighter spaces than the test probes presently available. Test probe 10 allows component spacing as close as 0.030 inch and a pin-to-pin center spacing as close as 0.040 inch. Test probe 10 is also low profile and all wires exit from one side. This allows connection of test clips at any desired distance away from leadless chip carrier 30 putting little or no strain on test probe 10. Also, test probe 10 is very stable when connected to leadless chip carrier 30 because flexible wires 21 exit one side of test probe 10 at approximately 0.300 inches above top 31 of leadless chip carrier 30. This compares with random wires exiting at greater than 1.25 inches above the top of the leadless chip carriers in the prior art. Thus, the lower profile of test probe 10 of the present invention provides greater stability of test probe 10 when it is mounted on leadless chip carrier 30 and thereby minimizes the chance of test probe 10 falling off leadless chip carrier 30.

Test probe 10 of the present invention is preferably fabricated by a molding process. In the first step of the molding process, pins 17 are alternately placed in adjacent slots 16 in pin holder 15 with first ends 18 of pins 17 protruding through the appropriate one of slots 16 in pin holder 15. Pins 17 having different length upper arms 20a and 20b are alternated. Then, pin holder 15 and pins 17 are placed in the mold assembly, and a first stage cap is placed over first ends 18 of pins 17 during the initial molding process. Next, the bottom half of housing 11 is molded and allowed to harden. The first stage cap is then removed, flexible wires 21 are soldered into place in contact with first ends 18 of pins 17, and the top half of housing 11 is then molded completing construction of test probe 10.

While the present device has been described in detail with reference to a particular specific embodiment thereof, it will be apparent to one of ordinary skill in the art that many modifications and alterations are possible within the spirit and scope of the invention. Therefore, the scope of the invention is to be determined from the claims appended hereto.

What is claimed is:

1. A device for testing and analyzing a leadless chip carrier having contact strips mounted to the surface of a printed circuit board, the device comprising:
   a resilient, nonconductive, thermoplastic housing having a top, a bottom and at least one side;
   a plurality of connector pins, each pin having a first end embedded in and extending towards said top of said housing, a second end embedded in and protruding from said bottom of said housing, said second end having a side arranged to mechanically contact a contact strip of the leadless chip carrier, and an arm portion extending towards the side of said housing and resiliently connecting said first end and said second end;
   rigid, nonconductive, holding means embedded in and extending towards said side of said housing, said holding means receiving said arm portions of said pins for spacing adjacent pins relative to each other and for permitting limited lateral movement of said second ends relative to said first ends and said housing; and
   a plurality of flexible wires each connected to a respective one of said first ends of said connectors pins inside said thermoplastic housing, said wires protruding from said housing to provide for remote attachment of test components to the device.

2. A device in accordance with claim 1 wherein said thermoplastic housing is made of a material having a sufficient resiliency to hold said connector pins in mechanical contact with the contact strips of the leadless chip carrier.

3. A device in accordance with claim 2 wherein said second ends of said connector pins define respective longitudinal axes, and wherein said first end of alternate connector pins is offset laterally from the respective longitudinal axis of said second end of the remaining connector pins.

4. A device in accordance with claim 2 wherein a pin-to-pin center spacing of said second ends is from about 0.040 inch to less than about 0.100 inch.

5. A device in accordance with claim 2 wherein said wires protrude from said housing at a position from about 0.250 to about 0.600 inches above said bottom of said housing.

6. A device in accordance with claim 1 wherein said connecting means comprises a pin holder mounted in said housing through which each of said connector pins passes, said first end of each pin being between the top of said pin holder and the top of said device.

7. A device in accordance with claim 6 wherein the bottom of said pin holder includes a plurality of slots, each said slot receiving said arm portion of one pin to prevent contact between adjacent pins and to prevent movement of said first end of each pin when force is applied against said second end of said pin.

8. A device in accordance with claim 7 wherein said pin arm portion includes an upper arm portion received by said slots and an opposed lower arm portion connecting said upper arm portion to said second end.

9. A device in accordance with claim 2 wherein said thermoplastic housing is made of silicone rubber.

* * * * *